United States Patent
Herguth et al.

(10) Patent No.: US 10,892,376 B2
(45) Date of Patent: Jan. 12, 2021

(54) METHOD AND DEVICE FOR PRODUCING A PHOTOVOLTAIC ELEMENT WITH STABILISED EFFICIENCY

(71) Applicant: UNIVERSITÄT KONSTANZ, Constance (DE)

(72) Inventors: Axel Herguth, Constance (DE); Svenja Wilking, Allmendingen (DE)

(73) Assignee: UNIVERSITÄT KONSTANZ, Constance (DE)

( * ) Notice: Subject to any disclaimer, the term of this patent is extended or adjusted under 35 U.S.C. 154(b) by 0 days.

(21) Appl. No.: 14/900,004

(22) PCT Filed: Sep. 26, 2013

(86) PCT No.: PCT/EP2013/070104
§ 371 (c)(1),
(2) Date: Dec. 18, 2015

(87) PCT Pub. No.: WO2014/206504
PCT Pub. Date: Dec. 31, 2014

(65) Prior Publication Data
US 2016/0141445 A1 May 19, 2016

(30) Foreign Application Priority Data
Jun. 26, 2013 (DE) .......................... 10 2013 010 575

(51) Int. Cl.
*H01L 31/18* (2006.01)
*H01L 31/068* (2012.01)
(Continued)

(52) U.S. Cl.
CPC .......... *H01L 31/1864* (2013.01); *F27B 9/066* (2013.01); *F27B 9/40* (2013.01);
(Continued)

(58) Field of Classification Search
CPC ......... H01L 21/67115; H01L 21/67109; H01L 31/1864; H01L 31/068; H01L 31/1804;
(Continued)

(56) References Cited

U.S. PATENT DOCUMENTS

2008/0012499 A1 * 1/2008 Ragay ............... H01L 21/67109
315/113
2010/0243036 A1 * 9/2010 Herguth .............. H01L 31/1804
136/252
(Continued)

FOREIGN PATENT DOCUMENTS

CN 101478882 7/2009
DE 102006012920 B3 1/2008
(Continued)

OTHER PUBLICATIONS

International Preliminary Report on Patentability dated Dec. 29, 2015, PCT Patent Application No. PCT/EP2013/070104 filed Sep. 26, 2013, The International Bureau of WIPO.
(Continued)

*Primary Examiner* — Dale E Page
*Assistant Examiner* — Quovaunda Jefferson
(74) *Attorney, Agent, or Firm* — Mannava & Kang, P.C.

(57) ABSTRACT

According to an example, in a method for producing a photovoltaic element with stabilised efficiency, a silicon substrate may be provided with an emitter layer and electrical contacts, which may be subjected to a stabilisation treatment step. Hydrogen from a hydrogenated silicon nitride layer may be introduced into the silicon substrate, for example, within a zone of maximum temperature. The silicon substrate may then be cooled rapidly in a zone in order to avoid hydrogen effusion. The silicon substrate may then be maintained, for example in a zone within a temperature range of from 230° C. to 450° C. for a period of, for
(Continued)

example, at least 10 seconds. The previously introduced hydrogen may thereby assume an advantageous bond state. At the same time or subsequently, a regeneration may be carried out by generating excess minority charge carriers in the substrate at a temperature of at least 90° C., preferably at least 230° C.

13 Claims, 1 Drawing Sheet

(51) Int. Cl.
| | | |
|---|---|---|
| *H01L 21/677* | (2006.01) | |
| *F27B 9/40* | (2006.01) | |
| *H01L 21/67* | (2006.01) | |
| *F27B 9/06* | (2006.01) | |

(52) U.S. Cl.
CPC .... *H01L 21/6776* (2013.01); *H01L 21/67109* (2013.01); *H01L 21/67115* (2013.01); *H01L 21/67248* (2013.01); *H01L 31/068* (2013.01); *H01L 31/1804* (2013.01); *H01L 31/1868* (2013.01); *Y02E 10/547* (2013.01); *Y02P 70/521* (2015.11)

(58) Field of Classification Search
CPC ........... H01L 21/6776; H01L 21/67248; H01L 31/1868; F27B 9/40; Y02P 70/521; Y02E 10/547; Y02E 10/54
See application file for complete search history.

(56) References Cited

U.S. PATENT DOCUMENTS

| | | | |
|---|---|---|---|
| 2010/0267188 A1 | 10/2010 | Parks et al. | |
| 2013/0102129 A1* | 4/2013 | Falster | H01L 31/1804 |
| | | | 438/471 |
| 2014/0147956 A1 | 5/2014 | Pochet et al. | |

FOREIGN PATENT DOCUMENTS

| | | | |
|---|---|---|---|
| EP | 2863413 A2 | 4/2015 | |
| FR | 2949607 A1 | 3/2011 | |
| FR | 2966980 A1 | 5/2012 | |
| JP | 2004241482 | 8/2004 | |
| JP | 200673715 | 3/2006 | |
| JP | 2008244166 | 10/2008 | |
| JP | 2009267380 | 11/2009 | |
| JP | 2011519111 | 6/2011 | |
| WO | 2008127920 A2 | 10/2008 | |
| WO | 2010121190 A1 | 10/2010 | |
| WO | 2011050399 A1 | 5/2011 | |
| WO | WO2011/050399 | * | 5/2011 |
| WO | 2013001440 A1 | 1/2013 | |
| WO | 2013173867 A1 | 11/2013 | |

OTHER PUBLICATIONS

Lim, et al., "Solar cells on low-resistivity boron-doped Czochralski-grown silicon with stabilized efficiencies of 20%", American Institute of Physics, Oct. 20, 2008, 4 pages.

Wilking, et al., "Influence of hydrogen on the regeneration of boron-oxygen related defects in crystalline silicon", Journal of Applied Physics, May 17, 2013, 6 pages, AIP Publishing LLC, Konstanz, Germany.

Krugel, et al., "Impact of Hydrogen Concentration on the Regeneration of Light Induced Degradation", ScienceDirect, Apr. 17-20, 2011, 6 pages, Elsevier Ltd., Freiburg, Germany.

Søndena, et al., "Light Induced Degradation in Monocrystalline Silicon Wafers made from the Metallurgical Route", 25th European Photovoltaic Solar Energy Conference and Exhibition, 5th Work Conference on Photovoltaic Energy Conversation, Sep. 6-10, 2010, 6 pages, Valencia, Spain.

Wilking, et al., "Influence of hydrogenated passivation layers on the regeneration of boron-oxygen related defects", ScienceDirect, Mar. 25-27, 2013, 8 pages, Elsevier Ltd., Hamelin, Germany.

Lim, et al., "Permanent deactivation of the boron-oxygen recombination center in silicon solar cells", Sep. 1-5, 2008, pp. 1018-1022.

Herguth, et al., "Kinetics of the boron-oxygen related defect in theory and experiment", Journal of Applied Physics, Dec. 10, 2010, 7 pages, American Institute of Physics.

International Search Report and Written Opinion dated Mar. 14, 2014, PCT Patent Application No. PCT/EP2013/070104 filed Sep. 26, 2013, European Patent Office.

\* cited by examiner

METHOD AND DEVICE FOR PRODUCING A PHOTOVOLTAIC ELEMENT WITH STABILISED EFFICIENCY

CLAIM FOR PRIORITY

The present application is a national stage filing under 35 U.S.C. § 371 of PCT application number PCT/EP2013/070104, having an international filing date of Sep. 26, 2013, which claims priority to German Patent Application Number 10 2013 010 575.7, having a filing date of Jun. 26, 2013, the disclosures of which are hereby incorporated by reference in their entireties.

FIELD OF THE INVENTION

The present invention relates to a method for producing a photovoltaic element whose efficiency is stabilised by a stabilisation treatment step. In particular, the present invention relates to a method for producing a solar cell based on a boron-doped, oxygen-containing silicon substrate. The invention relates further to a device for treating a silicon substrate within the context of the production of a photovoltaic element, wherein the device is configured to carry out the stabilisation treatment step of the method according to the invention.

TECHNICAL BACKGROUND

Solar cells, as photovoltaic elements, serve to convert light into electric current. Light-generated charge carrier pairs, which have been spatially separated, for example, at a pn junction between an emitter region and a base region, must thereby be fed to an external current circuit by means of electrical contacts of the solar cell. Electrical contact arrangements must be provided for that purpose on both the emitter and the base of the solar cell.

Solar cells are nowadays mostly manufactured on the basis of silicon as semiconductor substrate material. Silicon substrates are thereby frequently provided in the form of monocrystalline or multicrystalline wafers. It has been observed many times that, in the case of solar cells produced on the basis of crystalline silicon wafers, degradation effects may occur which reduce the efficiency of the solar cell over time. Significant efficiency losses of up to more than 1% abs have been observed.

DE 10 2006 012 920 A1 describes a method for producing a photovoltaic element with stabilised efficiency. The invention described therein belongs at least in part to the same inventors as the present application. It was recognised at that time that the efficiency of a photovoltaic element may be stabilised, that is to say degradation may be prevented, by carrying out on the photovoltaic element a stabilisation treatment step in which the photovoltaic element is maintained within an elevated temperature range for a sufficiently long period of time and at the same time excess minority charge carriers are generated in the silicon substrate, for example by illumination or by application of an electric voltage.

However, it has hitherto been assumed that process times for which a silicon substrate must be subjected to a stabilisation treatment step should be comparatively long in order to be able to achieve sufficient stabilisation of the efficiency. In the case of an automated industrial manufacturing line in particular, this may lead to delays and thus to the formation of a bottleneck in production.

SUMMARY OF THE INVENTION

There may therefore be a need for an improved method for producing a photovoltaic element with stabilised efficiency. In particular, there may be a need for such a method which allows the efficiency to be stabilised within short process times. Furthermore, there may be a need for a device for treating a silicon substrate within the context of a production of a photovoltaic element which in particular allows the stabilisation treatment step of the described method to be carried out.

Such a need may be met with the method and the device according to the independent claims. Embodiments of the invention are described in the dependent claims and in the following description.

According to a first aspect of the present invention there is described a method for producing a photovoltaic element with improved efficiency, which method comprises the following steps: A silicon substrate is provided. An emitter layer is formed at a surface of the silicon substrate. Electrical contacts are further formed on the silicon substrate. The method is characterised in that a stabilisation treatment step is additionally carried out. That step comprises purposively introducing hydrogen into the silicon substrate. When the hydrogen has been introduced into the silicon substrate, excess minority charge carriers are generated in the silicon substrate while the silicon substrate is at a temperature of at least 90° C., preferably at least 230° C.

According to a second aspect of the present invention there is described a device for treating a silicon substrate within the context of a production of a photovoltaic element, wherein the device is configured to carry out the stabilisation treatment step of the method according to the invention.

The device may be in a form of, for example, a continuous furnace having a plurality of zones which may be adjusted to different temperatures, and may have an illumination device by means of which minority charge carriers may be generated in the silicon substrate. The temperatures of the zones may be so controlled and the device, including the illumination device, may be so configured that a silicon substrate passing through the continuous furnace is first heated for a short time at a temperature above 650° C. in a high-temperature zone, is then cooled in a cooling zone at a cooling rate above 550° C. of at least 10 K/s to a temperature below 450° C. and is then maintained at a temperature of between 230° C. and 450° C. in a temperature maintenance zone, optionally for at least 10 seconds, and at the same time or subsequently, the silicon substrate is illuminated at a temperature of at least 90° C., preferably at a temperature above 230° C., with an illumination intensity greater than 0.3 kW/m².

Without limiting the scope of protection of the invention, ideas relating to embodiments of the method according to the invention or of the device according to the invention may be regarded as being based inter alia on the concepts and findings described below:

The possibility of protecting, or stabilising, a silicon substrate used within the context of the production of a photovoltaic element by means of a suitable stabilisation treatment step against degradation that otherwise occurs during operation of the photovoltaic element, which is sometimes also referred to as regeneration, has been known for a relatively long time. Details of how a stabilisation treatment step may be carried out and mechanisms of action that are presumed to lie behind it have been described in detail in DE 10 2006 012 920 A1.

It has now been recognised that, by means of additional process steps or suitably chosen process parameters, the rate of regeneration during the stabilisation treatment step may be increased considerably and the period of time for which the stabilisation treatment step is to be carried out in order to achieve sufficient efficiency stabilisation for the photovoltaic element that is ultimately produced may thus be kept as short as possible.

In particular, it has been observed that a rate of regeneration appears to depend significantly on the amounts of hydrogen that are present in the silicon substrate during the actual regeneration operation, that is to say while excess minority charge carriers are being generated in the silicon substrate at an elevated substrate temperature. Furthermore, how the hydrogen is distributed in the silicon substrate and the bond state of the hydrogen within the silicon substrate also appear to be important.

It is therefore proposed first to introduce hydrogen purposively into the silicon substrate. As described in greater detail below, this may be carried out in various ways. It has then been found to be advantageous to maintain the silicon substrate within a temperature range of from 230° C. to 450° C. at least for a short time, for example for at least 5 seconds or at least 10 seconds. It appears that the chosen maintenance time may be shorter, the higher the temperature at which the silicon substrate is maintained. It is presumed that maintaining the silicon substrate at an elevated temperature in this manner has an advantageous effect on the bond state of the hydrogen introduced previously. The actual regeneration operation may then be carried out by generating excess minority charge carriers in the silicon substrate while the silicon substrate is maintained at an elevated temperature of at least 90° C., preferably at least more than 230° C., but preferably less than 450° C. The excess minority charge carriers may optionally be generated in the silicon substrate while the silicon substrate is being maintained within the temperature range of from 230° C. to 450° C. as described above.

It has been observed that the regeneration operation may be accelerated considerably by the purposive introduction of hydrogen and the subsequent regeneration at elevated temperature. Instead of requiring at least several minutes, as presumed hitherto, it is assumed that the regeneration may be carried out within a few seconds and the entire stabilisation treatment step may accordingly suitably be carried out within a single device such as, for example, a continuous furnace.

This may make it possible, for example, within a production sequence frequently used industrially, in which screen printed contacts are fired in a continuous furnace, to modify the continuous furnace so that the stabilisation treatment step may also be carried out at the same time. By means of such a suitably modified continuous furnace it is accordingly possible simultaneously to carry out both contact formation by the firing of screen printed metallic paste structures and regeneration of the silicon substrate and thus stabilisation of the efficiency of the solar cell that is ultimately produced.

According to one embodiment, the hydrogen is introduced at temperatures above 650° C., and subsequent cooling to 450° C. is carried out with a ramp at a cooling rate above 550° C. of at least 10 K/s, preferably at least 20 K/s, more preferably at least 30 K/s and yet more preferably at least 60 K/s. In other words, the silicon substrate may first be heated to over 650° C. in order to drive in the hydrogen and then cooled rapidly to below 450° C., whereby at least the cooling to 550° C. is to take place particularly rapidly at a cooling rate of at least 10 K/s.

At high temperatures of significantly over 450° C., in particular over 550° C., hydrogen is able to diffuse into the silicon substrate very quickly, that is to say within a few seconds or fractions of seconds, and be distributed therein preferably as homogeneously as possible. For example, at sufficiently high temperatures, hydrogen from a hydrogen-containing layer applied to the silicon substrate is able to diffuse rapidly into the underlying silicon substrate.

However, it has been recognised that there is a danger that, should the high temperatures prevail for too long and the hydrogen source run out over time, hydrogen is also able to diffuse out of the silicon substrate again, that is to say an effusion of hydrogen may occur. There may be a depletion of hydrogen in particular at the surface of the silicon substrate, that is to say where the emitter layer, for example, is situated in the finished solar cell and the solar cell is accordingly particularly sensitive to degradation effects caused by defects. Since the hydrogen appears significantly to support a regeneration that is subsequently to be carried out, hydrogen effusion is therefore to be avoided as far as possible.

It is therefore proposed, after hydrogen has been introduced at a sufficiently high temperature, to reduce the temperature very quickly, that is to say to cool to silicon substrate to below 450° C. with a high cooling rate, in order to keep the period of time during which hydrogen could diffuse out of the silicon substrate as short as possible. Such rapid cooling is particularly desirable if the hydrogen source is on the verge of running out, that is to say no further hydrogen may be supplied, for example after too long a high-temperature phase, or if the hydrogen source is no longer able to release hydrogen, for example because the temperatures are too low.

The silicon substrate may subsequently be maintained at temperatures below 450° C. for a sufficiently long period of time, there scarcely being any effusion of hydrogen at those comparatively low temperatures but the hydrogen presumably being able to assume within the silicon substrate a bond state that is required for regeneration.

According to one embodiment, the excess minority charge carriers may be generated during the regeneration by illumination with an illumination intensity greater than 0.3 kW/m$^2$, preferably greater than 1 kW/m$^2$, more preferably greater than 3 kW/m$^2$, with light having wavelengths of less than 1180 nm.

It has been observed that a regeneration takes place all the more quickly, that is to say a rate of regeneration is all the greater, the higher the density of excess minority charge carriers. Excess minority charge carriers may be generated inter alia by illumination within the silicon substrate. A high illumination intensity may accordingly support rapid regeneration.

According to one embodiment, the excess minority charge carriers may be generated at a temperature of the silicon of between 230° C. and 450° C., preferably between 230° C. and 400° C. and yet more preferably between 230° C. and 350° C. and even more preferably between 230° C. and 300° C.

While it has hitherto been assumed that, although a rate of regeneration initially increases as the temperature increases above 50°, in particular above 90° C., but then appears to fall again above approximately 180° C., presumably owing to competing effects, it has now been recognised that, by previously introducing hydrogen and optionally subsequently maintaining the silicon substrate at a suitable temperature for a suitably long period of time, the silicon substrate may evidently be so pretreated that a regeneration operation may be carried out even at higher temperatures above 230° C. A regeneration appears to proceed more rapidly at a higher temperature. As a result of the previously introduced hydrogen and the temperature pretreatment, counteracting, competing effects appear to be weaker or to act significantly more slowly than the effects which take place in an accelerated manner owing to the pretreatment and bring about the regeneration. The competing effects therefore appear considerably to counteract the regeneration effects only at substantially higher temperatures of, for example, significantly over 300° C. Overall, therefore, a regeneration of the silicon substrate may be accelerated considerably owing to the pretreatment and the substantially higher temperatures during the actual regeneration operation that are made possible thereby.

According to one embodiment, the method that is presented may comprise depositing a hydrogen-containing layer on a surface of the silicon substrate, wherein that layer may serve a hydrogen source during the introduction of hydrogen into the silicon substrate.

Such deposition of a hydrogen-containing layer is technologically simple to carry out. For example, the hydrogen-containing layer may be in the form of a hydrogenated silicon nitride layer, that is to say a silicon nitride layer to which hydrogen has been added. Such a layer may be deposited, for example, by means of industrially proven methods such as, for example, PECVD (plasma enhanced chemical vapour deposition). Hydrogen is able to diffuse from the hydrogen-containing layer into the silicon substrate at elevated temperatures.

According to one embodiment, the hydrogen-containing layer may be covered with at least one further diffusion barrier layer which is less permeable to hydrogen than the hydrogen-containing layer itself. The further layer may thereby act, for example, as an outwardly acting diffusion barrier during the introduction of hydrogen into the silicon substrate at high temperatures, so that hydrogen is able to diffuse from the hydrogen-containing layer into the silicon substrate but is scarcely able to diffuse into the surrounding atmosphere. The diffusion barrier layer may be formed, for example, by a dielectric of sufficient density.

According to one embodiment, the silicon substrate coated with the hydrogen-containing layer may then be moved through suitably temperature-controlled zones in a continuous furnace.

In such a form of the method which is particularly simple to implement industrially, it is possible, for example, after the emitter layer has been formed at the surface of the silicon substrate, to deposit a hydrogen-containing dielectric layer such as, for example, a hydrogenated silicon nitride layer on the surface of the silicon substrate. This layer may be deposited in a suitable thickness, so that it may subsequently also act as, for example, an antireflection layer, a passivating layer or a dielectric mirror for the solar cell. Without major additional outlay, it is also possible to apply, for example, a denser $SiN_x$:H layer as the diffusion barrier layer, for example by correspondingly adapting gas flows of silane and ammonia (as precursor gases). It is thus also possible, by choosing appropriate thicknesses, to form a double antireflection coating, which may possibly be advantageous.

Screen printed contact structures may then optionally be printed on that layer. In a common high-temperature step, the silicon substrates so prepared are then sent through a continuous furnace and thereby pass through different temperature zones, so that on the one hand the screen printed contacts may be fired and on the other hand, by establishing a suitable temperature profile within the continuous furnace, at least parts of the stabilisation treatment step may also be carried out at the same time in order to stabilise the efficiency of the solar cell overall. For example, penetration of the hydrogen contained in the hydrogen-containing layer into the silicon substrate may take place during the firing step at over 650° C., then the substrate may be cooled rapidly to below 550° C., preferably to below 450° C., and maintained at temperatures of preferably below 450° C. for a period of, for example, at least 10 seconds. With such pretreatment inside the continuous furnace, the actual regeneration by generation of excess minority charge carriers may be carried out at an elevated temperature.

According to one embodiment, the excess minority charge carriers may be generated in a subsequent method step, for example after the silicon substrate has been maintained within the temperature range of from 230° C. to 450° C. In other words, after hydrogen has been introduced into the silicon substrate, the silicon substrate may first be maintained at elevated temperature without the generation of excess minority charge carriers. The hydrogenated silicon substrate is accordingly first only pretreated, and the actual regeneration process is subsequently carried out separately, in the same device or in a different device.

Alternatively, according to one embodiment, the excess minority charge carriers may be generated in a common method step together with the maintenance of the silicon substrate within the temperature range of from 230° C. to 450° C. In other words, it has been observed that the step of maintaining the silicon substrate at from 230° C. to 450° C. may be combined with the step of generating excess minority charge carriers at temperatures above 90° C., in particular above 230° C. Excess minority charge carriers may thereby already be generated in the silicon substrate, for example by illumination, as long as the silicon substrate is maintained at from 230 to 450° C. Overall, a considerable shortening of the duration of the stabilisation treatment step is to be expected as a result.

According to one embodiment, a device which is designed specifically for carrying out the stabilisation treatment step within the context of the production of a photovoltaic element may comprise a cooling device for actively cooling the silicon substrate within a cooling zone. Active cooling may thereby be understood as meaning that the silicon substrate does not mainly give off heat passively to the surroundings by radiation, but a heat loss of the silicon substrate is actively supported by further measures and/or effects such as, for example, forced convection.

According to one embodiment, the cooling device may comprise, for example, a fan for blowing a cooling gas into the cooling zone. For example, the cooling device may be designed purposively to blow inert gas, for example nitrogen, locally into the cooling zone. The gas may thereby have a low temperature, for example in the region of ambient temperature, preferably at least significantly below 100° C., but at least significantly below 300° C. The temperature and a flow of the blown-in gas may suitably be chosen so that a desired high cooling rate for the silicon substrate of, for example, more than 60 K/s is achieved in the cooling zone.

It is pointed out that possible features and advantages of embodiments of the invention are described herein in part in relation to a method according to the invention and in part in relation to a device according to the invention. A person skilled in the art will recognise that the described features may suitably be interchanged or combined and in particular may also be transferred in an analogous manner from the method to the device and vice versa.

A person skilled in the art will further recognise that a method according to the invention for producing a photovoltaic element may also comprise further method steps, for example cleaning steps, steps for forming suitable dielectric layers as antireflection layers, passivating layers, reflective layers, etc., further steps for forming electrical contacts or additional doped regions within the silicon substrate, etc. The described device for carrying out the stabilisation treatment step may also have, in addition to the described features, further structural and functional features, as may advantageously be used, for example, in the production of a silicon solar cell.

BRIEF DESCRIPTION OF THE DRAWINGS

The above-described and further possible aspects, features and advantages of the invention will become apparent from the following description of specific embodiments with reference to the accompanying drawings, wherein neither the description nor the drawings are to be interpreted as limiting the invention.

The figures are merely schematic and not true to scale. In the figures, the same reference numerals denote features that are the same or have the same effect.

Figure 1:
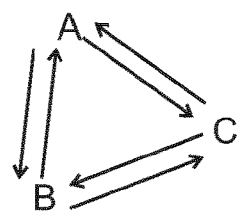
FIG. 1 shows a three-state model with which defect states within a silicon substrate and associated transitions between individual states, such as, for example, degradation or regeneration, may be explained.

DESCRIPTION OF PREFERRED
EMBODIMENTS OF THE INVENTION

Embodiments of the invention described hereinbelow relate in the broadest sense to a method for passivating or rendering harmless electrically active defects in silicon-based photovoltaic elements such as, for example, solar cells and solar modules. In particular, the defects may be boron-oxygen correlated defects, as are described in the literature, which may reduce considerably a quality (described by the (statistical) lifetime of the minority charge carriers) of the starting material and electrical performance parameters, which are dependent thereon, of the solar cell (current, voltage, efficiency under illumination) especially of monocrystalline but also generally of multicrystalline silicon or solar cells. An action of the method proposed herein on other defects too may not be ruled out.

A solar cell or a solar module is used to convert energy of incident ultraviolet/visible/infra-red light directly into electrically usable energy without using heat as an intermediate form. The internal photo effect is used for that purpose, in which electrons in a semiconducting material (e.g. silicon) are excited by electromagnetic radiation beyond an energetically prohibited band gap and accordingly absorb at least an energy corresponding to the band gap of the semiconductor. The person skilled in the art refers in this connection to the excitation of an electron-hole pair, because the excited (now mobile) electron leaves its original atom and the original (neutral) atom is then left with an excess positive charge (a "missing" electron=hole). If the excited, mobile electron is trapped again by a (positively charged) atom, the intermediately stored energy (corresponding to the band gap) is lost again. The person skilled in the art in this case refers to the recombination of an electron-hole pair. A recombination operation necessarily requires at least one electron and one hole.

In order to render the trapped energy of the light usable, electrons and holes must be separated from one another. In a typical solar cell, this is achieved by arranging an electron-rich (n-type doped) region and an electron-depleted hole-rich (p-type doped) region adjacent to one another in the component, forming a so-called pn junction. Because of the concentration differences of mobile electrons or holes in the adjacent regions and the resulting diffusion of the charge carriers, a potential gradient forms in the pn junction. This potential gradient permits spatial separation of electron-hole pairs, as a result of which recombination is suppressed and the stored energy may be made available to an external consumer via correspondingly arranged metal contacts separated according to polarity. A more detailed description is to be found in the established literature.

In order for this spatial separation of an electron-hole pair to occur, the minority charge carrier, that is to say the charge carrier that is complementary to the semiconductor type of the absorber material of a semiconductor substrate, must be able to diffuse from the absorber material into the region of the pn junction. If the absorber material has a large number of recombination-active defects which may bind electrons and holes alternately to one another and thus effect a recombination process, energy that is otherwise electrically usable is lost to the external consumer and the electrical performance of the solar cell deteriorates.

The density of the defects, or the resulting (readily measurable) mean lifetime of an electron-hole pair, is therefore a significant parameter for the quality of a semiconductor material and an electrical performance of the solar cells produced therefrom.

For solar cells, crystalline silicon may be used as absorber material in which electron-hole pairs are generated. The person skilled in the art distinguishes between monocrystalline and multicrystalline material, multicrystalline material being composed of a plurality of individual crystallites owing to the production process that is used. The different production processes thereby determine different properties of the material.

In the case of monocrystalline silicon, the process according to Czochralski (Cz-Si) is mostly used, in which a single silicon crystal is pulled from the molten silicon. The crude silicon used is mostly highly pure and has no notable contamination, in particular with oxygen. In the Czochralski process, however, there is used according to the current state of the art an optionally coated quartz crucible ($SiO_2$), which is attacked by the high chemical reactivity of the silicon, the temperatures used (melting temperature of silicon: 1410° C.), the convention in the melt and the rotation of the crucible, and is partially dissolved into the residual melt. This generally has the result that oxygen from the quartz crucible undesirably accumulates in the melt and is incorporated into the single silicon crystal as a foreign substance contaminant. Typically, the interstitial oxygen content of Cz-Si is in the range of from $5\times10^{17}$ to $3\times10^{18}$ $cm^{-3}$. The upper limit is given by the solubility. In the Czochralski process, lower oxygen concentrations in the crystal as a whole may reliably be achieved only by advanced methods, for example by means of magnetic fields which disrupt convection in the melt.

Monocrystalline material produced by the "float-zone" process, which provides highly pure and in particular also low-oxygen single silicon crystals especially for the electronics industry, is rarely used in the production of silicon-based solar cells due to high costs.

Multicrystalline silicon is generally produced by a different process, in which molten silicon is crystallised directionally in a (coated) quartz mould (e.g. Bridgeman process), wherein a plurality of crystallites generally form instead of a single crystal. In contrast to the Czochralski process, the melt does not rotate in this case and the convection movement is smaller. For this reason, the quartz mould used is attacked less by the molten silicon and less oxygen passes into the molten silicon. Depending on the process, the oxygen content of the multicrystalline material is lower than in the Czochralski process and is typically in the range of from $5 \times 10^{16}$ to $5 \times 10^{17}$ cm$^{-3}$. However, with appropriate implementation, the crystallites may reach the size of the solar cells produced later, so that it is virtually a monocrystalline material. The person skilled in the art here refers to quasi-monocrystalline material which, however, may have a lower oxygen content compared with materials produced by the Czochralski process.

The quality of the multicrystalline material is often lower than that of the corresponding monocrystalline material because the grain boundaries between adjacent crystallites act as strong recombination centres and may be problematic from a process point of view. This has the result that monocrystalline solar cells generally have higher efficiencies than comparable multicrystalline solar cells.

In order to be able to produce a pn junction, the absorber material must be doped. The material produced may either be electron-rich (n-type), in which case phosphorus is mostly used as the dopant, or hole-rich (p-type), in which case boron or gallium is chosen as the dopant. However, because of its better (almost identical) solubility behaviour in the crystal and the melt, boron is distributed more uniformly than gallium along the growth direction of the silicon crystal and is therefore more widely used as a dopant than gallium. Intentional or unintentional mixed dopings are also conventional. Conventional dopings range from $1 \times 10^{14}$ to $1 \times 10^{17}$ cm$^{-3}$, the value concretely used depending on the polarity of the absorber material and on the architecture of the solar cell.

It is further known that, when boron and oxygen are simultaneously present in the silicon crystal, boron-oxygen correlated defects may form or be activated within hours even at room temperature under illumination or charge carrier injection, that is to say under typical working conditions of solar cells and modules; such defects, as strongly recombination-active centres, may limit the lifetime of the minority charge carriers and thus also the electrical performance of the solar cell/solar module. In this connection, the person skilled in the art refers to boron-oxygen correlated degradation (see FIG. 1: transition from the inactive (annealed) state A by degradation to the active (degraded) state B) or limitation by boron-oxygen correlated defects. The less precise expression light-induced degradation, which is due not only to boron-oxygen correlated defects but also to other light-induced defects, is also common in this connection.

The activated and thus recombination-active boron-oxygen correlated defects (see FIG. 1: state B) may be converted into a recombination-inactive state again by heating for a short time at 100-200 or 100-300° C. in the dark (see FIG. 1: transition from the active state B by annealing to the inactive state A). However, the boron-oxygen correlated degradation proceeds again with renewed illumination or charge carrier injection, so that the defects are also called metastable.

The density of the (activated) defects depends approximately linearly on the boron concentration and approximately quadratically on the oxygen concentration in the silicon substrate. This effect therefore concerns in particular boron-doped oxygen-rich silicon materials which have been produced by the Czochralski process. In the case of solar cells based on highly doped (boron content $1 \times 10^{16}$ or at least $2 \times 10^{15}$ cm$^{-3}$), oxygen-rich (content $1 \times 10^{18}$ or at least $5 \times 10^{17}$ cm$^{-3}$) substrates, the efficiency may thereby be reduced significantly (~1% abs efficiency loss). Concrete degradation losses may vary according to the architecture of the solar cell that is used.

It has also been shown, however, that multicrystalline silicon materials having typically lower oxygen contamination also exhibit the effect, as do silicon materials in which boron is not the dominant dopant, in particular also phosphorus-doped partially compensated materials with boron additions.

Hitherto, four approaches for solving or avoiding the problem of boron-oxygen correlated degradation have been known especially.

A first approach starts by minimising the undesirable oxygen contamination of the silicon crystal. On the one hand, novel coatings of the quartz crucible are to prevent dissolution thereof. On the other hand, especially in the Czochralski process, magnetic fields are used, with which the convection movement of the molten silicon is suppressed directly at the quartz crucible, as a result of which material removal from the quartz crucible may be minimised. Correspondingly produced MCz silicon has correspondingly lower oxygen concentrations in the range of from $1 \times 10^{17}$ to $5 \times 10^{17}$ cm$^{-3}$. However, the production process is generally more expensive and more susceptible to faults as compared with the normal process.

The second approach is based on reducing the boron concentration in the starting material. Theoretical calculations show that the efficiency potential without the limitation by boron-oxygen correlated defects is maximum at dopings of about $1 \times 10^{16}$ cm$^{-3}$, while it reaches a maximum only at lower dopings if the boron-oxygen correlated degradation is taken into account. However, the maximum efficiency potential falls as the doping falls, so that although lower doped materials suffer lower degradation losses, the maximum efficiency potential may not be utilised fully. The optimum doping of the silicon substrate depends on the concrete architecture of the solar cell. This approach especially is currently being adopted by most manufacturers, who use materials having boron concentrations in the range of from $1 \times 10^{15}$ to $5 \times 10^{15}$ cm$^{-3}$ in the case of oxygen-rich Cz silicon.

In the third approach, the dopant boron is replaced by gallium, for example. It has been possible to show that, when gallium is used, either no corresponding defects occur or the defects are recombination-inactive. However, unlike boron, gallium does not have optimum solubility behaviour in the crystal and the melt, as a result of which it is a technical challenge to produce a crystal that is doped homogeneously over the crystallisation direction. Greater material wastage and a higher susceptibility of the process to faults, and thus higher costs, are the consequence. It is therefore questionable whether this approach is economically feasible.

The fourth approach makes use of the fact that the boron-oxygen correlated defect may be present not only in an inactive (see FIG. 1: state A) and an active state (see FIG. 1: state B), which may be converted into one another by charge carrier injection, that is to say degradation, or heating in the dark, that is to say annealing, but also in a third recombination-inactive "regenerated" state (see FIG. 1: state C) which, according to current knowledge, forms from the active state B by regeneration.

This state is characterised in particular in that (a) it possesses weak or negligible recombination activity and (b) is stable, in contrast to the inactive state that is initially present, under illumination or charge carrier injection at temperatures<150° C., that is to say renewed activation of the defects and thus degradation do not occur.

According to present knowledge, conversion of the active defect, that is to say of state B, into the inactive third state C requires a charge carrier injection, for example by illumination or operation of the solar cell in the forward direction at slightly elevated temperatures in the range of from 50 to 230° C., higher temperatures or higher excess charge carrier densities accelerating the conversion of the defects. Owing to the conversion of the defects present, there are no limitations in this approach as regards oxygen and boron content.

The process of converting the active defects (state B) into the described third "regenerated" state C is referred to hereinbelow as "regeneration" and is described in detail and claimed in DE 10 2006 012 920.2.

The economy of the regeneration process depends substantially on the rate of regeneration, or the period of time that is required to bring a sufficiently large number of defects into the regenerated, advantageous state C. A process which is able to increase the rate of regeneration and thus reduce the required period of time is therefore of great economic interest.

It may be regarded as an object of the invention inter alia to provide a method for producing a photovoltaic element so that the process referred to as "regeneration" may be carried out more efficiently, that is to say in a shorter time and with lower costs, and the efficiency potential of silicon-based solar cells may thus better be utilised. It may not be ruled out that the described production process also acts on other defects in silicon and may also be used there with slight adaptations.

According to one embodiment of the invention there is provided a method for producing a photovoltaic element, for example a usable solar cell or module or a precursor, which comprises the following steps:

providing an oxygen-containing silicon substrate doped e.g. with boron or optionally with a different dopant, and forming an emitter layer to form a pn junction at the surface of the silicon substrate, whereby (a) hydrogen is introduced into the silicon substrate, (b) the substrate, if required in the concrete process, experiences a temperature of>450° C. for only a short time, if no fresh hydrogen is introduced into the silicon substrate during this phase, (c) the substrate is optionally maintained in the temperature range 230-450° C. for a certain period of time, and excess minority charge carriers are optionally generated in the substrate during this phase, and then optionally (d) the substrate is maintained in the temperature range 50-230° C. and excess minority charge carriers are generated during this phase.

Process step (d) just corresponds to the method according to DE 10 2006 012 920 A1. The method having partial steps (a) to (c) that is presented here aims inter alia to change a photovoltaic element in such a manner that the process described in DE 10 2006 012 920 A1 may be optimised and thus may proceed in an economically attractive manner.

The silicon substrate used in the method according to the invention may be a wafer which has been produced by the Czochralski process and has a boron doping in the range of from $1\times10^{15}$ to $1\times10^{17}$ $cm^{-3}$. Such a wafer has a certain oxygen concentration, resulting from its production, of, for example, from $1\times10^{17}$ to $3\times10^{18}$ $cm^{-3}$. It is also possible, however, to use other boron-doped, oxygen-containing silicon substrates, such as, for example, multicrystalline silicon wafers or silicon layers which have been deposited on a carrier from the gas or liquid phase.

In order to bring about the potential gradient (pn junction) that is required for the separation of electron-hole pairs, an emitter is formed according to the invention ar the surface of the silicon substrate. This is a region which generally has a semiconductor type opposite to the semiconductor type of the substrate. If boron is the dominant dopant in the substrate, the substrate is p-doped. It may not be ruled out that the semiconductor type of the substrate is n-type despite the boron doping if corresponding amounts of n-doping substances, such as phosphorus, are present. Formation of the emitter may take place, for example, by a superficial diffusion of dopants such as phosphorus (in the case of a p-type substrate) or boron (in the case of an n-type substrate). Such a diffusion is typically carried out at temperatures above 800° C. However, different methods may also be used to produce a corresponding emitter layer. For example. an emitter layer of corresponding polarity may be deposited on the substrate surface from a gaseous or liquid phase or from a plasma. A further possibility for producing an emitter layer may be the alloying of corresponding materials. Furthermore, the surface of the silicon substrate does not have to be covered completely. It may be sufficient to cover only a part region of the surface on the front and/or rear side with an emitter layer.

The case in which the emitter and the substrate are of the same semiconductor type may also be realised, for example if the substrate and the emitter layer have a greatly different band structure (hetero structures) so that there is established at the interface a band bending which effects the desired potential gradient. In the borderline case, a semiconductor does not even have to be used, because a correspondingly chosen metal may also lead to such a band bending (MIS structures).

The introduction of hydrogen into the silicon substrate is essential within the context of the method according to the invention because a silicon crystal typically does not contain significant amounts of hydrogen.

Hydrogen may be introduced by a very wide variety of methods. For example, the hydrogen may be released within the context of a temperature step from coatings applied to one or both sides, such as hydrogenated silicon nitrides (a-SiNx:H), hydrogenated silicon carbides (a-SiCx:H), hydrogenated silicon oxides (a-SiOx:H), hydrogenated silicon oxynitrides (a-SiOxNy:H), hydrogenated aluminium oxides ($Al_2O_3$), hydrogenated amorphous silicon (a-Si:H) or comparable layers, which may also have different functions (e.g. passivation of the surface, antireflection coating), and may penetrate the silicon crystal. The exact parameters, in particular as regards temperatures at which the hydrogen bonded in the layer is released, vary from layer to layer and are described in different embodiments. Corresponding analogous embodiments for comparable layers will be apparent to the person skilled in the art.

It should also be mentioned at this point that the production of the metal contacts may require a high-temperature step which may also lead to the release of hydrogen from hydrogenated coatings.

According to one embodiment there is used as the hydrogen source hydrogenated silicon nitride (a-SiNx:H), which is restructured during a high-temperature step at temperatures above 600° C. and releases hydrogen in atomic and molecular form, which is able to penetrate into the silicon substrate. The amount of hydrogen released may depend on (a) the composition of the layer before the high-temperature step, (b) the maximum temperature, (c) the temperature profile, in particular the duration of the high-temperature step.

In general, more hydrogen is released at a higher rate at higher temperatures. Furthermore, it is expedient if the hydrogen is distributed throughout the substrate and in particular also penetrates deep into the substrate.

The temperature management during the high-temperature step is to be so chosen that (I) temperatures above 600° C. are achieved, which lead to the release of hydrogen, (II) the temperature management and duration is such that a sufficient amount of hydrogen diffuses into the substrate, and (III) distribution of the hydrogen in the substrate is ensured.

For example, this may be achieved within the context of a process of alloying the metal contacts of a solar cell, in which temperatures>750° C. are present for a few seconds.

The argumentation is analogous with similar layers which release hydrogen within the context of a high-temperature step, such as, for example, hydrogenated silicon carbides, hydrogenated silicon oxides or hydrogenated silicon oxynitrides. Corresponding analogous adaptations of the temperature management will be apparent to the person skilled in the art.

According to a further embodiment there is used as the hydrogen source hydrogenated aluminium oxide ($Al_2O_3$), which is able to release hydrogen, which may penetrate into the substrate, within the context of a temperature step at temperatures>250° C. Here too, analogously to the case of silicon nitride layers discussed above, the maximum temperature, temperature profile and duration are to be chosen accordingly in order to achieve a sufficiently high and well distributed hydrogen concentration in the substrate. In order to support the distribution of the hydrogen in the substrate, excess minority charge carriers may be generated in the substrate during the temperature step. This may be effected, for example, by illumination or, for example, by passing in an external current.

According to a further embodiment, hydrogenated amorphous silicon (a-Si:H) is used as the hydrogen source, hydrogen being released within the context of a temperature step at temperatures>100° C. Here too, analogously to the cases discussed above of, for example, silicon nitride layers and aluminium oxides, the maximum temperature, temperature profile and duration are to be chosen accordingly in order to achieve a sufficiently high and well distributed hydrogen concentration in the substrate. In order to support the distribution of the hydrogen in the substrate, excess minority charge carriers may be generated in the substrate during the temperature step. This may be effected, for example, by illumination or for example by passing in an external current.

According to a further embodiment, multilayer systems, for example of the layers mentioned above, may also be used. For example, the layer system may be in such a form that the layer adjacent to the substrate serves as the hydrogen source, and at least one further layer is situated thereon.

At least one of the further layers may act as a hydrogen diffusion barrier, that is to say that further layer is less permeable to hydrogen than the underlying hydrogen-containing layer and the diffusion of hydrogen through that layer within the context of a high-temperature step accordingly proceeds only comparatively slowly. In this case, this layer serves as a hydrogen reflector and the hydrogen released from the hydrogen source is held better in the substrate. This is advantageous because the yield of hydrogen from the source layer, that is to say the ratio of the amount of hydrogen that has diffused into the substrate to the amount that is released, is better in this case and, as discussed later, out-diffusion at lower temperatures is also minimised.

It is also conceivable in principle to place another layer between the source layer and the substrate, which other layer does not influence the diffusion of the hydrogen from the source layer into the substrate. A barrier layer for hydrogen is likewise conceivable at the same place in specific cases.

The introduction of hydrogen into the substrate may also be carried out in a different way. For example, the hydrogen may be implanted into the silicon substrate, that is to say protons are correspondingly accelerated and shot at or into the substrate. Depending on the chosen process parameters, in particular the energy of the protons as well as the dose thereof, a hydrogen distribution in the substrate may purposively be produced. The actual ion implantation may be followed by a high-temperature step>500° C., which on the one hand is to heal crystal damage which may occur upon braking of the protons, and on the other hand may effect a further redistribution of the hydrogen.

The introduction of the hydrogen into the substrate may additionally also take place, for example, by a diffusion of atomic hydrogen from an atmosphere enriched with hydrogen or in a hydrogen-containing plasma.

In addition, other methods of introducing the hydrogen into the silicon substrate are also conceivable, although they are not mentioned explicitly here.

Within the context of the method according to the invention it is further desirable that a sufficient amount of the hydrogen that has been introduced remains in the substrate. To that end, the substrate should not be at temperatures>400° C., in particular>450° C., for a prolonged period unless fresh hydrogen from the above-mentioned or other sources is available, because hydrogen effusion otherwise occurs to a significant degree.

In particular in the case where the introduction of hydrogen requires higher temperatures, for example where the hydrogen is released from hydrogenated layers such as, for example, silicon nitrides, the period of time in the temperature range in which the layer releases less hydrogen into the substrate than effuses out of the substrate should be minimised.

It may further be disadvantageous to generate excess minority charge carriers at temperatures above 400° C., in particular above 450° C., because this may place the hydrogen in a more mobile charge state and thus support the effusion thereof.

According to the embodiment in which hydrogenated silicon nitride layers (a-SiNx:H) are used as the hydrogen source, it is appropriate, for example, to avoid the temperature range between 400° C. and 450° C. and 600-650° C. and to lower the substrate temperature in a short time from temperatures above 650° C. to a temperature below 450° C., whereby a cooling rate in particular above 550° C. of greater than 3 K/s, better greater than 30 K/s, is appropriate.

In this respect, the embodiment having at least one diffusion barrier layer for hydrogen, as already described, may be particularly advantageous because the hydrogen is prevented from effusing from the substrate even in the temperature range in question>400° C. or>450° C. In this case, lower cooling rates greater than 0.3 K/s may also be acceptable.

Within the context of the method according to the invention, it may be advantageous to maintain the substrate in the temperature range 230-450° C. for a certain period of time of at least 10 seconds and not more than 30 minutes. This may be effected, for example, in the form of a plateau or, for example, in the form of a temperature ramp.

It has been found that the desired effect to be achieved by the method according to the invention, of increasing the rate of regeneration as the substrate temperatures increase, may be achieved within a shorter treatment time. Furthermore, for the desired effect of increasing the rate of regeneration, it is in principle not necessary to generate excess minority charge carriers in the substrate. As explained below, it may nevertheless be advantageous to generate excess minority charge carriers in the substrate, in order also to influence the diffusion of hydrogen in the mentioned temperature range by manipulating the charge state.

According to one embodiment, the substrate is maintained at a temperature in the range of from 230 to 450° C. without generation of excess minority charge carriers, whereby higher temperatures reduce the necessary maintenance time, until the desired effect has been achieved. The substrate is then cooled down to room temperature with a steep temperature ramp. The substrate may subsequently be fed to the regeneration process as described in DE 10 2006 012 920 A1.

According to another embodiment, the substrate is maintained at a temperature in the range of from 230 to 450° C. without generation of excess minority charge carriers, whereby higher temperatures reduce the necessary maintenance time, until the desired effect has been achieved. Immediately thereafter, the substrate is transferred to the temperature range of from 50 to 230° C., in which the regeneration process may proceed in a manner analogous to that described in DE 10 2006 012 920 A1.

According to another embodiment, the substrate is maintained at a temperature in the range of from 230 to 450° C. with generation of excess minority charge carriers, for example by illumination, whereby higher temperatures reduce the necessary maintenance time, until the desired effect has been achieved. In addition to increasing the rate of regeneration, there may under certain circumstances also be partial or complete regeneration even at temperatures>230° C. Immediately thereafter, the substrate is transferred to the temperature range of from 50 to 230° C., in which the regeneration process continues, as required, and may proceed in an accelerated manner owing to the regeneration which has already occurred in part.

A complete embodiment of a method according to the invention will be illustrated by way of example below. In this embodiment, hydrogenated silicon nitride is used as the hydrogen source, the layer having been applied to only one side of a silicon wafer, while the opposite side is covered completely with aluminium. On the silicon nitride layer, which also acts as an antireflection coating and passivating layer, there is a metallic paste which has been applied locally by screen printing, for example, and attacks the silicon nitride layer at high temperatures, thus establishing contact with the underlying silicon. The release of the hydrogen from the silicon nitride layer takes place within the context of a typical alloying process of the metallisation of the photovoltaic element, which typically takes place above 750° C. in a belt furnace.

Figure 2:
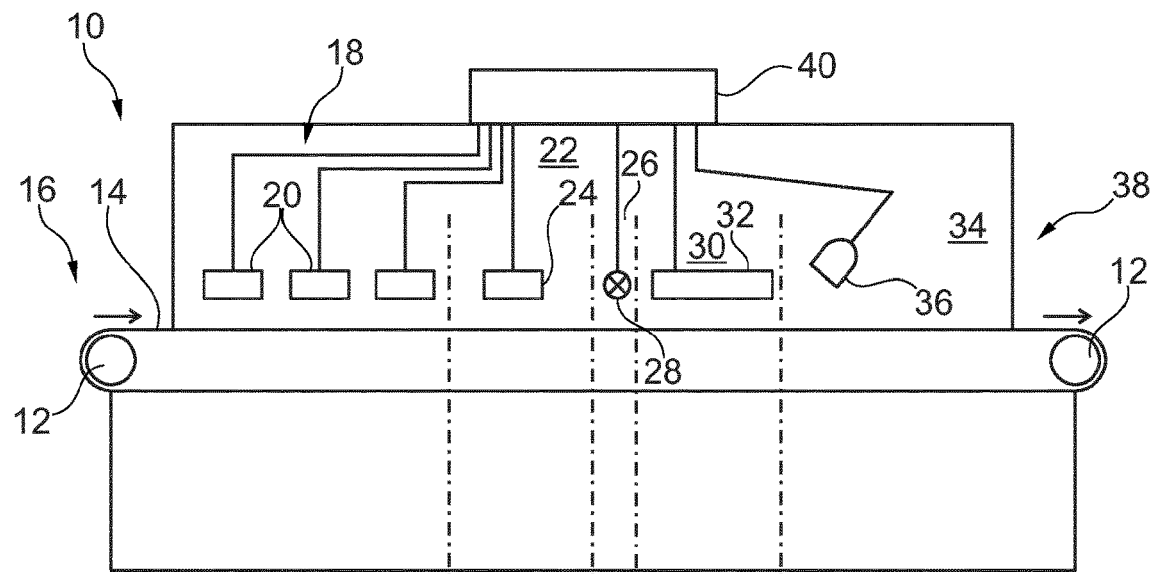
FIG. 2 shows a device for treating a silicon substrate within the context of the production of a photovoltaic element according to an embodiment of the present invention.

FIG. 2 shows a device in the form of a specially configured continuous furnace 10 which may be used for the treatment of a silicon substrate within the context of the production of a solar cell and which is designed to execute an embodiment of the production method described herein and in particular of the stabilisation treatment step which is thereby to be carried out.

The continuous furnace 10 has a belt 14 which may be moved by driven rollers 12. On an inlet side 16, silicon substrates may be placed onto the belt 14 and then moved by means of the belt 14 through differently heated zones of the continuous furnace 10. The silicon substrates may previously have been provided on their surface with a hydrogen-containing layer. In addition, a pattern of metal-containing paste may have been printed onto the hydrogen-containing layer, whereby the metal contacts for the solar cell are ultimately to be formed.

In a preheating zone 18 there are arranged one or more radiant heaters 20 by means of which the silicon substrates transported on the belt 14 may be preheated to temperatures up to above 500° C.

In an adjacent maximum heating zone 22, at least one further radiant heater 22 is provided, by means of which silicon substrates passing through may be heated for a short time at temperatures up to above 700° C.

There follows a cooling zone 26. In the cooling zone 26, not only is there preferably no radiant heater, there is even provided a cooling device 28, by means of which the silicon substrates passing through may actively be cooled. The cooling device may be in the form of, for example, a fan for blowing cool nitrogen gas into the cooling zone 26.

This may be followed by a temperature maintenance zone 30. In the temperature maintenance zone 30 there is provided a further radiant heater 32, by means of which the temperature of the silicon substrates may be maintained in a range of from 230° C. to 450° C. within the temperature maintenance zone 30. The length of the temperature maintenance zone 30 may be such that, at a given throughput speed, a silicon substrate transported by the belt 14 requires at least 10 seconds to be transported through the temperature maintenance zone 30, whereby it is maintained by means of the radiant heater 32 at a desired temperature within the temperature range of from 230 to 450° C. In particular, the temperature maintenance zone 30 may be, for example, at least as long as, preferably at least three times longer than, preferably at least six times longer than, the maximum heating zone 22. The continuous furnace as a whole may, for example, be more than twice as long as a conventional continuous furnace without a temperature maintenance zone 30.

The silicon substrate then reaches a cooling down zone 34 in which it may cool further. In the cooling down zone 34 there may be provided a strong light source 36, for example in the form of a laser with a widened laser beam or in the form of a strong lamp with wavelengths which may be absorbed by the silicon substrate, in order to illuminate the silicon substrates passing through with illumination intensities of at least 0.3 kW/m². Because the silicon substrates are still at a temperature significantly above 90° C. at least at the start of the cooling down zone 34, the regeneration process may thereby be effected and the solar cells ultimately produced may be stabilised in terms of their efficiency.

Alternatively or in addition, a light source may also be provided in the temperature maintenance zone 30 (not provided in the embodiment shown in FIG. 2). By suitably illuminating the silicon substrates already in the temperature maintenance zone 30, the hydrogen that has penetrated into the silicon substrates may optionally be supported in assuming a state that is advantageous for a subsequent regeneration. On the other hand, by means of suitable illumination already within the temperature maintenance zone 30, regeneration within the silicon substrates may be carried out at least partially or, with suitable process management, optionally also completely.

All the described components of the continuous furnace 10 may preferably be controlled by a common control system 40.

When the silicon substrates have passed through the entire continuous furnace 10, they may be removed at an outlet side 38 and subjected to further processing or characterisation steps.

Figure 3:
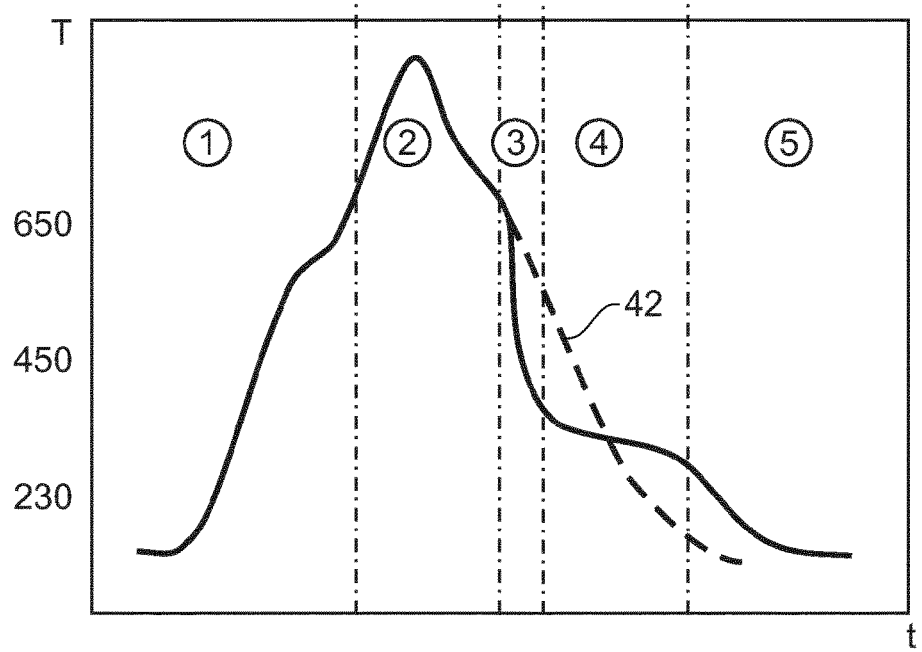
FIG. 3 shows a temperature profile of a substrate during passage through the device shown in FIG. 2.

FIG. 3 shows by way of example a temperature management during passage of the wafer through various zones of the belt furnace 10.

On entry into the belt furnace and passage through the preheating zone 18 (zone 1), the wafer serving as the silicon substrate is first heated until, at about 650° C., the release of hydrogen from the hydrogenated silicon nitride layer previously deposited thereon and diffusion into the wafer (zone 2) begin. When the maximum temperature has been reached in the maximum heating zone 22, the release of hydrogen from the silicon nitride layer decreases again. At the same time, a portion of the hydrogen that has diffused into the wafer already effuses again. If the temperature falls below approximately 650° C., the effusion from the wafer exceeds the release of hydrogen from the silicon nitride layer, or the diffusion into the wafer, and the hydrogen content of the wafer falls again. In order to prevent this as far as possible, the wafer is cooled down in the cooling zone 26 (zone 3) with a steep temperature ramp at a high cooling rate of, for example, more than 20 K/s and further effusion of the hydrogen is suppressed. Immediately thereafter in the adjacent temperature maintenance zone 30 (zone 4), the wafer is maintained in the temperature range of from 230 to 450° C. and, according to the described method, the process that increases the rate of regeneration, which manifests itself in a later regeneration process step, begins. The regeneration time required later may further be shortened by generating excess charge carriers, for example by illumination in zone 4. This is not absolutely essential but is beneficial for the economy of an overall process consisting of the method described herein and the method according to DE 10 2006 012 920 A1 which is optionally already included or is to be carried out separately. The regeneration method analogous to DE 10 2006 012 920 A1 may follow directly in zone 5. However, it may also take place separately if desired.

In FIG. 3 there is also shown in addition as a broken line 42 a typical temperature profile during passage through a conventional continuous furnace, as is conventionally used, for example, for the firing of screen printed contacts. It will be seen that the silicon substrates cool continuously and approximately linearly after reaching a maximum temperature. A dwell time within the temperature range above 450° C. is significantly longer than in the continuous furnace according to the invention, whereas a dwell time within the temperature range between 230° C. and 450° C. is significantly shorter than in the continuous furnace according to the invention.

Further details, features and advantages of embodiments of the invention will also become apparent to the person skilled in the art from the following description of an underlying model.

In the following, a model is to be presented with which the shortening of the time constant of the regeneration process could be explained. It is pointed out that the precise causal relationships which lead to the increase in the rates of regeneration that is observed in the method according to the invention and thus to a more efficient implementation of the regeneration process were not yet understood in detail at the time of preparing the present patent application. The model that is presented is therefore not to limit the scope of protection, as is defined by the accompanying claims, in any way.

The inventors assume that hydrogen, in particular the amount thereof, the bond state thereof and the charge state thereof in the silicon crystal, has a decisive influence on the conversion of the recombination-active defects into the third, regenerated state (state C), for example by attachment of the hydrogen to the defect. Because there is generally no or too little hydrogen in the silicon crystal directly after crystal growth, hydrogen must first be introduced into the crystal in order to permit conversion to the regenerated state. In principle, various hydrogen sources are suitable, as have been described above.

Ultimately, the inventors assume that the origin of the hydrogen is of lesser importance within the context of this model, as long as there is a sufficiently high concentration in the crystal of the silicon substrate in the temperature range below approximately 450° C. and there is sufficiently homogeneous distribution both laterally and in terms of depth. Above approximately 400 or approximately 450° C., hydrogen may still escape to a significant degree from the silicon crystal into the surroundings. The described production process according to the invention takes this into account by only briefly exposing the solar cell in the production process to a temperature range of>400 or>450° C. in which the hydrogen diffuses out but fresh hydrogen is not supplied, for example from a layer.

In addition, studies by the inventors make it appear plausible that the bond state or charge state of the hydrogen is of critical importance. Accordingly, the hydrogen could be present in the temperature range below approximately 500° C. for the large part in at least two different bond states, for example in the form of $H_2$ molecules or bound to boron atoms as B—H pairs. However, hydrogen in such bound form would not be sufficiently mobile. The regeneration would correspond in this description to a detachment of the hydrogen, subsequent diffusion in atomic form and attachment to a boron-oxygen correlated defect. The rate of regeneration, that is to say the rate of conversion of defects in the degraded state (state B) into the regenerated state (state C), and thus also the period of time that is required for the regeneration process to proceed, depends in this model inter alia on how easily the hydrogen may be freed from its bound state, either with purely thermal support or also by a change of the charge state. The described production process according to the invention may optionally ensure that a sufficient amount of hydrogen is present in the only slightly bonded (at least under charge carrier injection) state and is thus available for the regeneration process. Furthermore, the mobility of the atomic hydrogen after cleavage is dependent on its charge state. In p-type silicon, the hydrogen is generally positively charged and its diffusion is hindered by electrostatic interaction in the crystal lattice. If the hydrogen is in the neutral charge state, on the other hand, its mobility is significantly higher. Studies show that the charge state may be manipulated by charge carrier injection (illumination or by passing in a current). Accordingly, by means of charge carrier injection, the mobility of the hydrogen may be so influenced that it reaches defects in the silicon crystal more rapidly owing to its higher mobility and may also passivate them on account of its charge state.

Merely as an additional attempt at formulation, which is not intended to limit the invention in any way, forms of the invention and concepts underlying embodiments thereof may also be described as follows:

1. Method for producing a photovoltaic element with increased capability or speed of passivating electrically active defects in crystalline silicon, comprising the following steps:
providing a silicon substrate having defects;
forming an emitter layer on the surface of the silicon substrate;
characterised in that
hydrogen is introduced into the silicon substrate and the silicon substrate is maintained in a temperature range of 230-450° C.
2. Method according to form 1, wherein the silicon substrate is maintained in a temperature range of 230-450° C. for a period of at least 2 seconds, preferably at least 10 seconds, more preferably at least 30 seconds, yet more preferably at least 90 seconds.
3. Method according to one of the preceding forms, wherein the hydrogen is introduced at temperatures above 450° C. and cooling takes place above 450° C. with a ramp of at least 3 K/s, preferably 10 K/s, more preferably 30 K/s, yet more preferably 60 K/s.
4. Method according to form 3, wherein the cooling ramp relates to the temperature range of from 700° C. to 450° C.
5. Method according to one of the preceding forms, wherein excess minority charge carriers are generated in the silicon substrate.
6. Method according to form 5, wherein the illumination intensity is greater than 0.3 kW/m$^2$, preferably greater than 1 kW/m$^2$, more preferably greater than 3 kW/m$^2$, and light with wavelengths<1180 nm is used.
7. Method according to one of the preceding forms, wherein the excess charge carriers are generated at a substrate temperature between 230° C. and 450° C., or preferably between 230° C. and 400° C., or more preferably between 230° C. and 350° C. or yet more preferably between 230° C. and 300° C.
8. Method according to one of the preceding forms, wherein at least one hydrogen-containing coating serves as hydrogen source.
9. Method according to form 8, wherein at least one of the hydrogen-containing coatings is hydrogenated silicon nitride.
10. Method according to one of the preceding forms, wherein the hydrogen is introduced by means of a high-temperature step at temperatures above 650° C., preferably 700° C., more preferably 750° C.
11. Method according to one of the preceding forms, wherein the hydrogen-releasing layer is covered with at least one diffusion barrier layer which is less permeable to hydrogen than the hydrogen-releasing layer.

Finally, it is pointed out that the terms "comprise", "have", etc. are not to exclude the presence of further additional elements. The term "one" or "a" also does not exclude the presence of a plurality of elements or objects. Furthermore, in addition to the method steps mentioned in the claims, further method steps may be necessary or advantageous, for example in order finally to finish a solar cell.

The reference numerals in the claims serve merely for better readability and are not to limit the scope of protection of the claims in any way.

LIST OF REFERENCE NUMERALS

A annealed, inactive state
B degraded, active state
C regenerated, inactive state
(1)-(5) heating zones
10 continuous furnace
12 driven rollers
14 belt
16 inlet side
18 preheating zone
20 radiant heater
22 maximum heating zone
24 radiant heater
26 cooling zone
28 cooling device
30 temperature maintenance zone
32 radiant heater
34 cooling down zone
36 light source
38 outlet side
40 control system
42 temperature curve in a conventional continuous furnace

The invention claimed is:
1. A method for producing a photovoltaic element with stabilised efficiency, comprising the following steps:
providing a silicon substrate;
forming an emitter layer at a surface of the silicon substrate;
forming electrical contacts on the silicon substrate;
wherein the method further comprises a stabilising treatment step comprising:
introducing hydrogen into the silicon substrate from a hydrogen-containing dielectric layer applied onto the silicon substrate, wherein the hydrogen is introduced at temperatures of the substrate above 650° C. and subsequent cooling the substrate to 450° C. is carried out with a ramp at a cooling rate of at least 10° C./s, preferably at least 20° C./s, more preferably at least 30° C./s, yet more preferably at least 60° C./s, while the substrate is at a temperature above 550° C. during the cooling of the substrate; and
generating excess minority charge carriers in the silicon substrate while the silicon substrate is at a temperature above 230° C., wherein the excess minority charge carriers are generated by illumination with an illumination intensity greater than 1 kW/m$^2$ with light having wavelengths less than 1180 nm.
2. The method according to claim 1, wherein the stabilisation treatment step further comprises a step of maintaining the silicon substrate within a temperature range of from 230° C. to 450° C. for a period of at least 10 seconds, preferably at least 30 seconds, after hydrogen has been introduced into the silicon substrate.
3. The method according to claim 2, wherein the excess minority charge carriers are generated in a subsequent method step after the silicon substrate has been maintained within the temperature range of from 230° C. to 450° C.
4. The method according to claim 2, wherein the excess minority charge carriers are generated in a common method step together with the maintenance of the silicon substrate within the temperature range of from 230° C. to 450° C.

5. The method according to claim 1, wherein the excess minority charge carriers are generated by illumination with an illumination intensity greater than 3 kW/m$^2$.

6. The method according to claim 1, wherein the excess minority charge carriers are generated at a temperature of the silicon substrate of between 230° C. and 450° C., preferably between 230° C. and 400° C., more preferably between 230° C. and 350° C. and yet more preferably between 230° C. and 300° C.

7. The method according to claim 1, further comprising depositing on at least one surface of the silicon substrate the hydrogen-containing layer which serves as hydrogen source during the introduction of hydrogen into the silicon substrate.

8. The method according to claim 1, wherein the hydrogen-containing layer is a hydrogenated silicon nitride layer.

9. The method according to claim 1, wherein the hydrogen-containing layer is covered with at least one layer which is less permeable to hydrogen than the hydrogen-containing layer.

10. The method according to claim 1, wherein the silicon substrate is coated with the hydrogen-containing layer and the silicon substrate is then moved in a continuous furnace through zones whose temperature is suitably controlled.

11. A method for treating a silicon substrate within the context of the production of a photovoltaic element in a device being in the form of a continuous furnace having a plurality of zones including a maximal heating zone, a cooling zone and a temperature maintenance zone, wherein the plurality of zones is adjustable to different temperatures and comprises an illumination device, wherein the device comprises in each of its maximal zone and temperature maintenance zone at least one radiant heater for heating the silicon substrate to an elevated temperature and wherein the device comprises in its cooling zone no radiant heater but a cooling device for actively cooling passing silicon substrates, the method comprising:

heating a silicon substrate passing through the continuous furnace for a time at a temperature above 650° C. in the maximal heating zone;

following the heating, cooling the silicon substrate to a temperature below 450° C. in the cooling zone at a cooling rate of at least 10° C./s, while the substrate is at a temperature above 550° C. during the cooling of the silicon substrate; and following the cooling,
maintaining the silicon substrate at a temperature of between 230° C. and 450° C. in the temperature maintenance zone; and at the same time or subsequently as the maintaining, illuminating the silicon substrate at a temperature of at least 230° C. with an illumination intensity greater than 1 kW/m$^2$ with light having wavelengths less than 1180 nm.

12. The method of claim 11, further comprising:
introducing hydrogen into the silicon substrate during the heating of the silicon substrate passing through the continuous furnace for a time at a temperature above 650° C. in the maximal heating zone.

13. The method of claim 11, wherein cooling the silicon substrate further comprises cooling the silicon substrate with a ramp at a cooling rate of preferably at least 20° C./s, more preferably at least 30° C./s, yet more preferably at least 60° C./s, while the silicon substrate is at a temperature above 550° C. during the cooling of the silicon substrate.

* * * * *